United States Patent [19]

Burrowes et al.

[11] Patent Number: 4,785,352
[45] Date of Patent: Nov. 15, 1988

[54] SAMPLED DATA AMPLITUDE DETECTOR AS FOR AN AGC MULTIPLIER

[75] Inventors: Sherwin D. Burrowes, East Windsor; Alfred Y. Kwan, Mine Hill Township, Morris County, both of N.J.

[73] Assignee: RCA Licensing Corporation, Princeton, N.J.

[21] Appl. No.: 782,132

[22] Filed: Sep. 30, 1985

[51] Int. Cl.[4] .......................... H04N 5/52; H04N 9/44
[52] U.S. Cl. ...................................... 358/174; 358/27; 307/356; 375/98
[58] Field of Search .................. 358/174, 176, 179, 21, 358/27; 315/383, 307, 366, 367; 375/76, 75, 98; 455/234, 241, 246, 250; 307/355, 356, 358

[56] References Cited

U.S. PATENT DOCUMENTS

| 4,344,021 | 8/1982 | Johnston | 315/383 |
| 4,434,439 | 2/1984 | Steckler et al. | 358/174 |
| 4,491,862 | 1/1985 | Flamm | 358/21 |
| 4,510,521 | 4/1985 | Ruprecht et al. | 358/27 |

Primary Examiner—Tommy P. Chin
Attorney, Agent, or Firm—Eugene M. Whitacre; Paul J. Rasmussen; Eric P. Herrmann

[57] ABSTRACT

A sampled data signal amplitude detector for use in PLL's, for example, includes an absolute value detector to generate the magnitudes of the signal samples to be measured. The magnitudes of pairs of successive samples are compared and the larger magnitude sample of each pair is provided to an averager. The averager, averages a predetermined number of the larger magnitude samples and outputs the average as the amplitude of the applied signal.

9 Claims, 4 Drawing Sheets

SAMPLED DATA AMPLITUDE DETECTOR AS FOR AN AGC MULTIPLIER

This invention relates to circuitry for detecting the peak amplitude of a sampled data signal.

BACKGROUND OF THE INVENTION

This invention will be described in the environment of a digital television receiver, but it will be recognized to be applicable to a much broader range of applications utilizing peak detecting of sampled data signals.

Digital television receivers currently commercially available include analog circuitry to receive conventional broadcast TV signals and develop baseband composite TV signals. The baseband composite signal is coupled to an analog-to-digital converter (ADC) which translates the analog signals to pulse code modulated (PCM) binary signals. The PCM signals are processed in digital or binary arithmetic circuitry to separate and process the luminance and chrominance components of the composite signal. The processed digital luminance and chrominance components (color difference signals) are subsequently converted to analog signals which are coupled to analog matrixing circuitry for developing RGB color signals to drive a kinescope.

The ADC and digital processing circuitry operate synchronously responsive to a clock signal which is phase locked to the color reference burst transmitted with the composite signal. The clock signal is developed in a phase-locked-loop (PLL) circuit which develops its phase error signals from the PCM encoded burst signal. The frequency of the clock signal is typically selected to be four times the color subcarrier frequency and aligned to a particular phase of burst to facilitate digital processing. Once the clock signal is phase locked, successive samples of the burst component comprise a sequence of quadrature related samples, e.g. I, Q, $-I$, $-Q$, I, Q, etc.

In order to maximize the performance of the PLL, it is advantageous to incorporate an automatic gain control (AGC) circuit to condition the received burst signal to have a nominal amplitude. This requires an amplitude detector to measure the differential between the actual and the desired amplitude. Once the clock is phase locked to burst and if one of the clock phases is aligned with the peak of burst, the amplitude of burst is easily determined by comparing the value of the sample developed during that clock phase to a reference value. However, if none of the clock phases are aligned with the peaks of burst, but if the sampling phase $\theta$ of a particular sample of burst relative to the peaks of burst is known the amplitude, A, of burst may be determined from the equation $$A = S/\sin\theta \quad (1)$$

where S is the value of the particular sample. Alternatively, the burst amplitude may be determined from pairs of successive samples from the equation $$A = \sqrt{I^2 + Q^2} \quad (2)$$

because of the quadrature relationship of the I and Q samples. However, the circuitry requires to compute the burst amplitude from either of these equations is undesirably complicated. In addition, during the period that the PLL circuit has not yet achieved phase lock, each of the above methods may produce particularly large errors of burst amplitude measurement.

An object of the present invention is to provide a relatively simple sampled data signal amplitude detector with improved accuracy over the above-described system.

SUMMARY OF THE INVENTION

The amplitude detector of the present invention includes an absolute value circuit to convert all samples to be detected to one polarity. Circuitry examines successive pairs of the unipolar samples to the determine which of the pairs of samples is larger and selects the larger sample as the current peak amplitude of the sample sequence.

DETAILED DESCRIPTION

Figure 1:
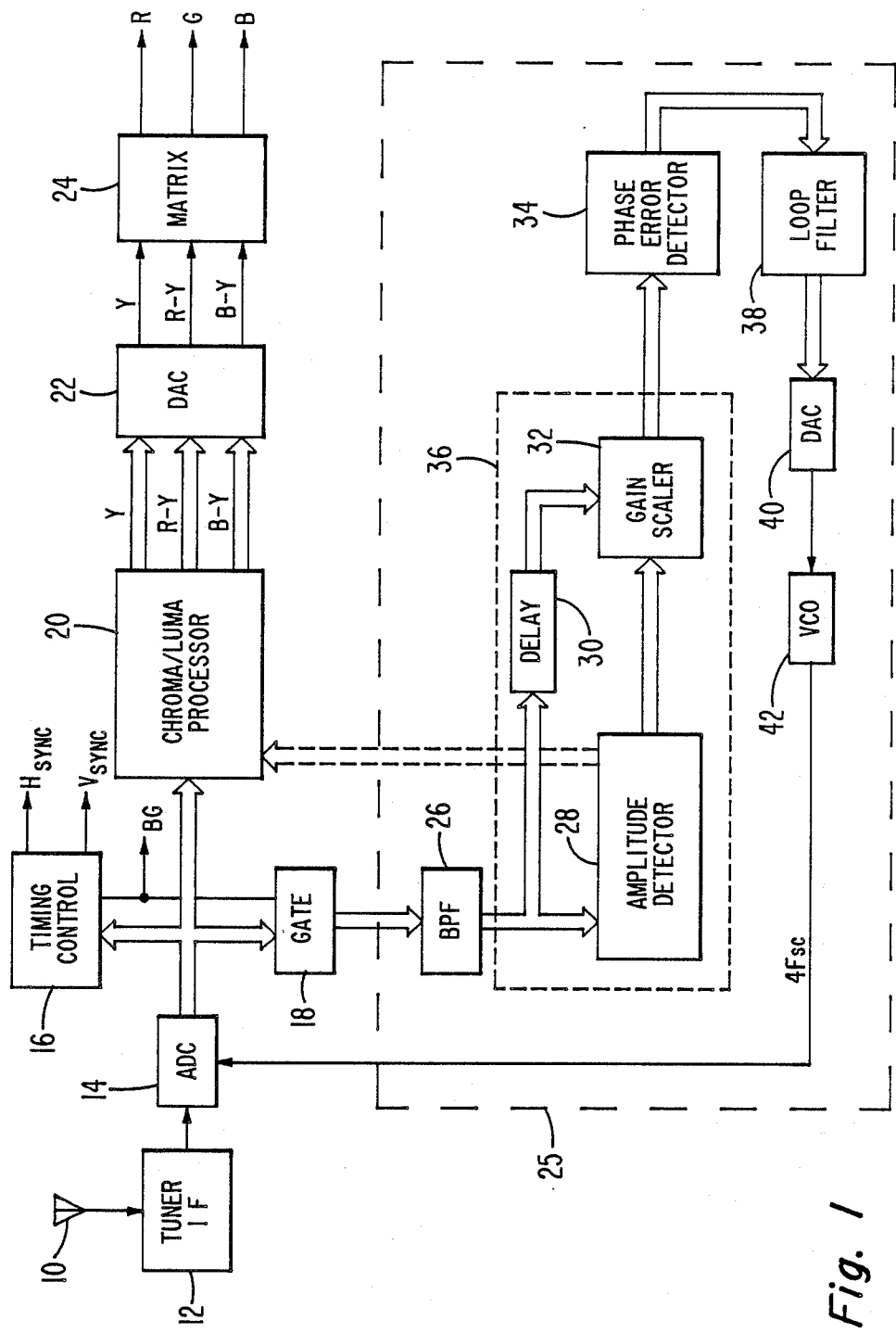
FIG. 1 is a block diagram of a portion of a digital TV receiver including sample clock generating phase-lock-loop circuitry incorporating AGC circuitry.

In the drawings, broad arrows interconnecting circuit elements represent multiconductor parallel bit data paths and narrow arrows represent single wire conductors for single bit or serial digital signals or analog signals.

Figure 4:
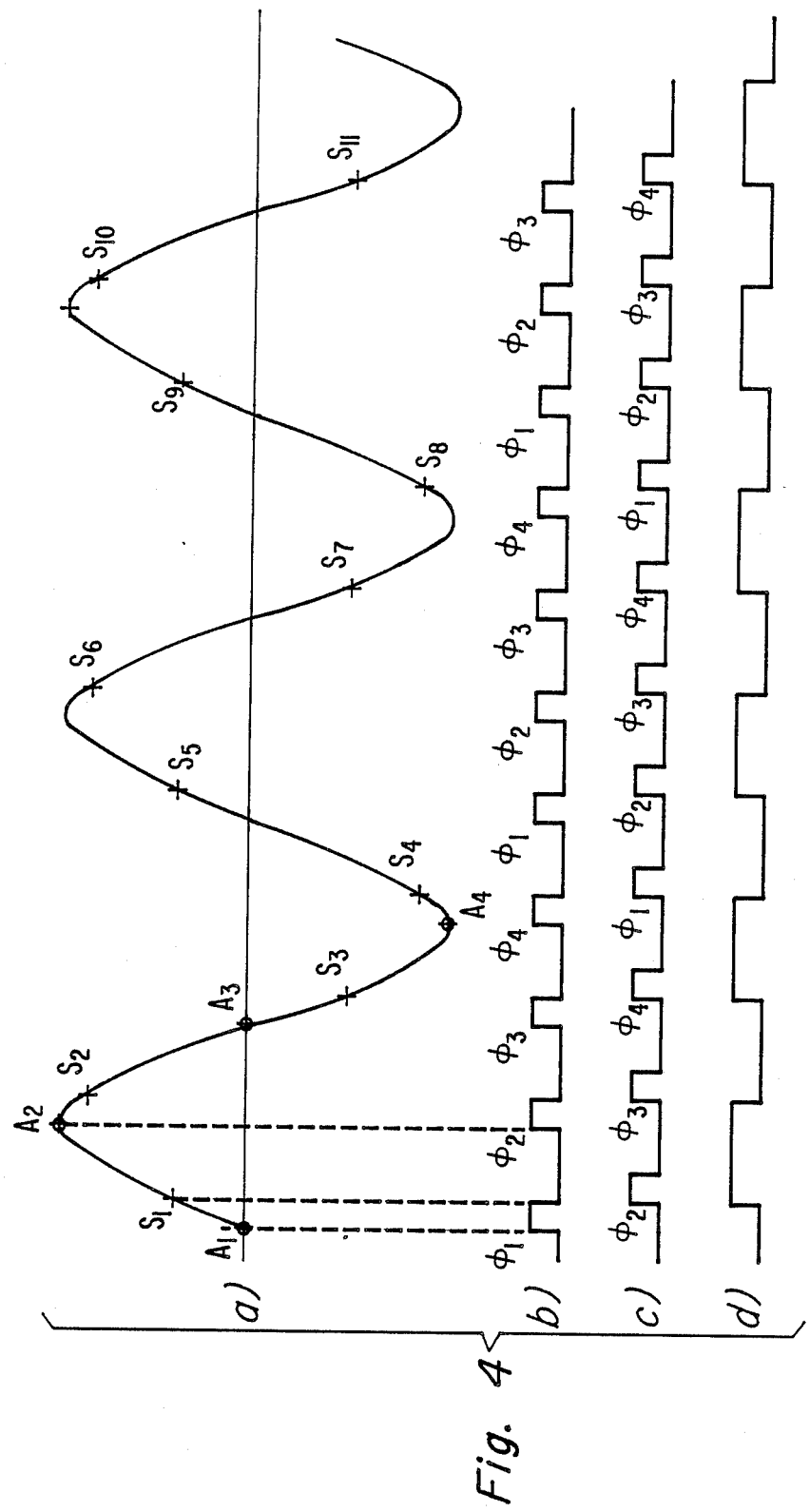
FIG. 4 is a waveform diagram useful in understanding the advantages of the invention.

Refer to the waveforms of FIG. 4. Waveform (a) is an analog representation of a portion of a color burst reference signal. Waveform (b) is a clock signal which is phase and frequency locked to the burst signal with the clock frequency being four times the color burst frequency. The clock signal of waveform (b) has the desired phase relationship to waveform (a). If waveform (a) is sampled by an analog-to-digital converter clocked by the clock signal of waveform (b), the values produced by the ADC correspond to the sequence of amplitude values denoted $A_1$, $A_2$, $A_3$, $A_4$, etc. It can be seen that the magnitude of the samples $A_2$ and $A_4$ developed by clock phases $\phi_2$ and $\phi_4$ correspond to the peak value of the burst signal. Thus, when the clock is phase locked to the color burst signal as shown, the amplitude of the color burst signal is equal to the magnitude of the samples developed by either clock phase $\phi_2$ or $\phi_4$.

Waveform (c) represents a clock signal which does not have the desired phase relationship to the color burst as may occur when the phase lock system initially starts. The phase relation is arbitrary and may translate over an appreciable number of degrees before acquiring phase lock. The frequency of the clock signal of waveform (c), for convenience, is shown to be four times the color burst frequency, but this is not a necessary condition for operation of the circuitry to be described.

If the color burst signal is sampled responsive to the clock signal illustrated in waveform (c), the sequence of samples produced will correspond to the amplitudes S1, S2, S3, S4, etc. Now assume that the system were to measure the amplitude of the color burst by examining the samples produced by clock phase $\phi_2$, i.e. samples S1, S5, S9, etc. (or samples S1, S3, S5, S7, etc. produced by clock phases $\phi_2$ and $\phi_4$). From the waveforms it can be seen that the amplitude measurement will have a large error. And since during system start-up, the clock phase-color burst relationship is not known, it is not possible to select samples, i.e. a clock phase, that will provide samples that closely approximate the color burst amplitude.

The present invention examines successive samples, and always selects the larger as an estimate of the amplitude value. In one embodiment the magnitudes of successive samples are compared in exclusive pairs and the larger magnitude used as the amplitude value. In this embodiment, the magnitude of sample $S_n$ is compared with the magnitude of sample $S_{n+1}$, the magnitude of sample $S_{n+2}$ is compared with the magnitude of sample $S_{n+3}$ and so on. In a second embodiment, the magnitude of each successive pair of samples is compared and the larger is selected. For example, the magnitude of sample $S_n$ is compared with the magnitude of sample $S_{n+1}$. Then the magnitude of sample $S_{n+1}$ is compared with the magnitude of sample $S_{n+2}$, etc. Both embodiments require only relatively simple hardware and develop amplitude values with relatively small errors over a considerable range of phase errors.

FIG. 1 shows, in block form, portions of a digital TV receiver including a phase-lock-loop for developing a system clock phase locked to the color burst component of composite video signal. Broadcast TV signals are received by antenna 10 and coupled to the tuner-IF circuitry 12 which produces baseband composite video signal. Circuitry 12 may be realized with conventional analog tuner and IF components. The baseband composite video signal is coupled to ADC 14, which, responsive to the clock signal $4F_{sc}$, produces a sequence of PCM or binary values representing the composite video signal.

The PCM samples are coupled to timing control circuitry 16 which extracts the horizontal and vertical synchronizing signals and develops horizontal and vertical deflection signals and a burst gate signal. The PCM samples from ADC 14 are also applied to the chroma/luma processor 20 which separates the luminance, Y, and chrominance components and appropriately enhances these signals. Chroma/luma processor 20 produces an enhanced PCM luminance signal, and enhanced PCM color difference signals (R−Y) and (B−Y). The PCM signals from chroma/luma processor 20 are coupled to digital-to-analog converter (DAC) circuitry 22 which converts them to analog form. The analog luminance and color difference signals are then combined in matrix circuitry 24 to develop R, G and B color signals for driving a conventional kinescope.

PCM samples from ADC 14 are coupled to gating circuit 18, which, responsive to the burst gate signal from timing control circuitry 16, applies the color burst component of the PCM component video signal to PLL circuitry 25. PLL circuitry 25 develops the system clock signals for operating the ADC 14 and chroma/luma prosessor 20 etc. In the following description the main system clock that is developed is presumed to be phase locked to −(B−Y) component of the color burst signal and has a frequency of four times the frequency of the color burst signal. It will be appreciated however that other frequencies and phase relationships may be selected. With respect to FIG. 4, phase locking the clock to the −(B−Y) component of burstoccurs when the leading edge of clock phases $\phi_1$ and $\phi_3$ coincide with the zero-crossings (points A1 and A3) which correspond to the (R−Y) component.

PCM color burst samples are coupled to the bandpass filter 26 which removes signal noise and DC components from the gated color burst signal. Samples from filter 26 are applied to AGC circuitry 36. AGC circuitry 36 includes an amplitude detector 28, a gain scalar 32 and a delay element 30. Amplitude detector 28 responsive to the PCM color burst signal determines the magnitude of burst and generates a scale factor corresponding to the difference between the measured magnitude and a preset nominal burst amplitude, e.g. 20 IRE peak value. This scale factor is applied to the gain scaler 32. The gain scaler 32 scales the PCM color burst signal by this scale factor. The PCM color burst signal from bandpass filter 26 is coupled to the gain scaler 32 by a delay element 30. Delay element 30 compensates for the processing delays of detector 28. Note however, delay element 30 may be eliminated if the detected amplitude from the current line is used to scale the color burst signal on the next subsequent line. Since the amplitude of burst is generally constant from line-to-line this is a reasonable approach though the system response time will be slower.

The scaled color burst signal is coupled to a phase error detector 34 which develops a signal corresponding to the current phase error of the clock signal. Phase error detector 34 may be a latch clocked by the $\phi_1$ or the $\phi_3$ phases of the clock signal. Note that when the clock is locked to the −(B−Y) phase of burst the samples coinciding with clock phases $\phi_1$ and $\phi_3$ will have zero values. Deviations from zero values are indicative of phase errors. The polarity of the deviation in conjunction with the polarity of the −(B−Y) samples is indicative of the angular direction of phase error and the magnitude of the deviation is trigonometrically proportional to the magnitude of phase error. For an example of this type of error detector see U.S. Pat. No. 4,491,862 entitled "Color Television Receiver With At Least One Digital Integrated Circuit For Processing The Composite Video Signal" incorporated herein by reference.

Samples from the phase error detector 34 are coupled to a loop filter 38 which tends to smooth the phase error signal. The filtered phase error signal is converted to analog form in DAC 40, and the analog signal used to control the voltage controlled oscillator circuit (VCO) 42. VCO 42 develops the $4F_{sc}$ clock signal and other system clock signals as is known in the art of digital TV receivers.

In FIG. 1 an output of the amplitude detector 28 is shown coupled to the chroma/luma processor 20. This is to indicate that the burst magnitude value or the scale factor may also be utilized in, for example, ACC circuitry included in processor 20.

Figure 2:
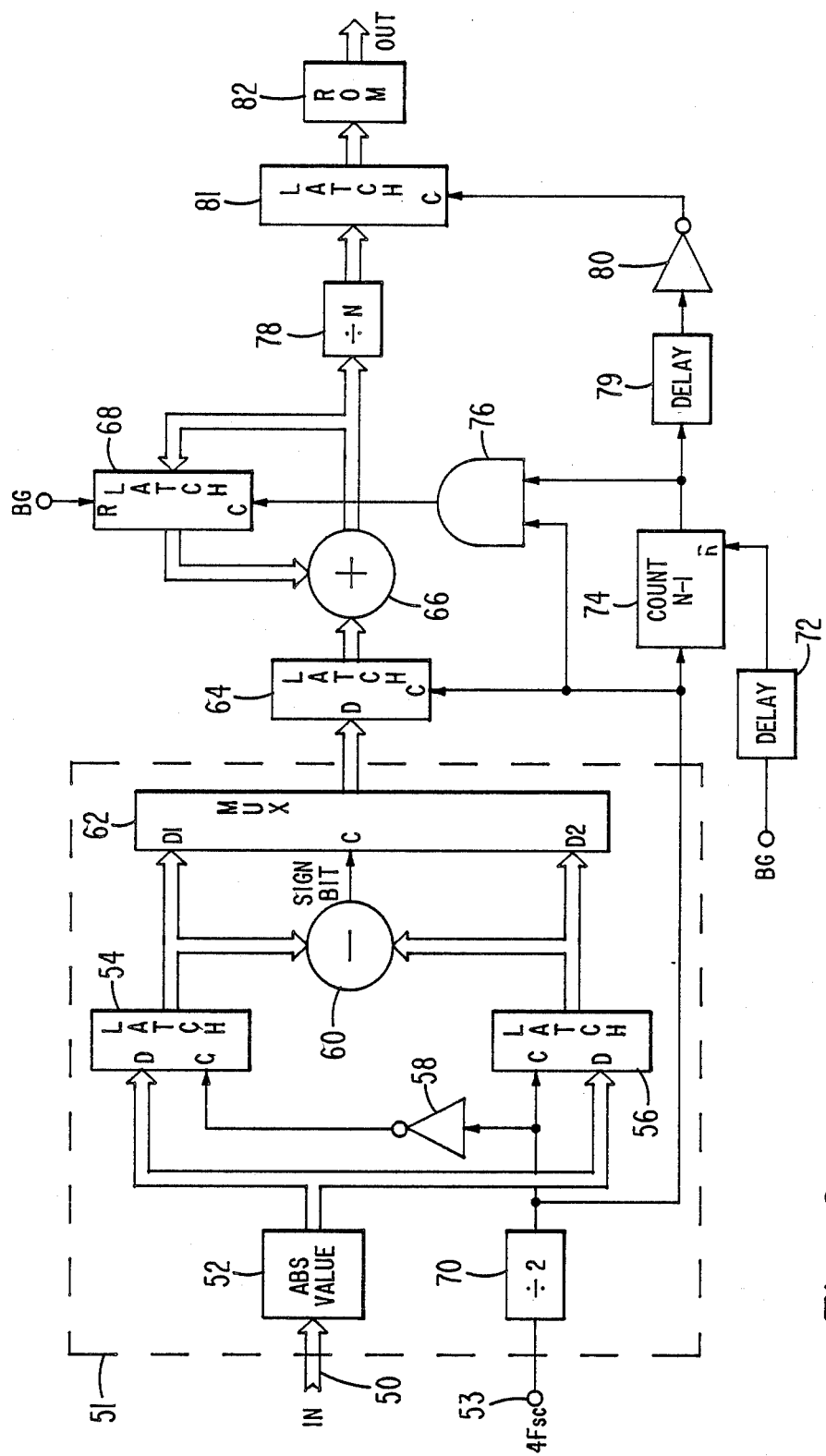
FIGS. 2 and 3 are block diagrams of amplitude detectors embodying the present invention and which may be used in the AGC circuitry of FIG. 1.

FIG. 2 illustrates the first embodiment of the invention. In FIG. 2 the elements cicumscribed by broken line 51 form the basic amplitude detector. The remaining elements tend to form an averaged value of the amplitude over 2N samples and generates a scale factor for controlling the gain scaler 32 of FIG. 1.

The signal to be measured, e.g. the color burst signal, is applied to input buss 50 and a 4 Fsc clock signal synchronous with the occurrance of color burst samples is applied to terminal 53. The 4 Fsc clock signal is coupled to divider 70 which produces a clocking signal of one-half the sample rate (waveform (d) in FIG. 4). This half-rate clock is applied to the clock input of data latch 56 and to the input of inverter 58. Inverter 58 generates the complement of the half-rate clock which is applied to the clock input of data latch 54.

The color burst samples are coupled to the absolute value circuit 52 which produces the magnitudes of the applied samples. The magnitude values are coupled to data latches 54 and 56, which, clocked by complementary half-rate clock signals successively store alternate samples. For the sample sequence S1, S2, S3, ... shown in FIG. 4, samples S1, S3, S5, S7 ... are successively stored in latch 56 and samples S2, S4, S6, S8 ... are successively stored in latch 54. The samples in latches 54 and 56 are coupled to respective input ports of subtracter 60 and to respective input ports of multiplexor 62. Subtracter 60 operates to compare the samples stored in latches 54 and 56. The polarity or sign output bit from subtracter 60 is coupled to the control input of multiplexor 62. The inputs to the subtracter and the control of the multiplexor are arranged so that the larger of the sample magnitudes in latches 54 and 56 is coupled to the output port of multiplexor 62. For example assume that the sign bit output by subtracter 60 is a "one" for negative differences and a "zero" for positive differences. Also assume that the D1 and D2 data inputs to multiplexor 62 are coupled to the multiplexor output for one and zero control input signals respectively. To effect these conditions the outputs of latches 54 and 56 will be respectively coupled to the subtrahend and minuend inputs of subtracter 60.

The output of multiplexor 62 is coupled to the data input port of data latch 64 which is clocked by the half-rate clock. When data latch 64 is clocked, i.e., by the leading transition of the half-rate clock, two successive samples are present in latches 54 and 56 and the larger is loaded into latch 64. On each cycle of the half-rate clock, two different samples are present in latches 54 and 56. Consequently latch 64 will be loaded with the larger of different pairs of samples each cycle time. The output of latch 64 corresponds to the larger of the positive and negative instantaneous magnitude of the sampled data (PCM) signal applied to input port 50.

In order to minimize the effects of noise and account for the frequency response i.e. the envelope of the color burst signal, it is desirable to average the magnitude samples. This is done by summing N magnitude samples and dividing the sum by N. Summing is performed by coupling the output of latch 64 to one input of adder 66. The output of adder 66 is stored in latch 68 and applied to a second input of adder 66 during successive sample periods to effect addition of the previous sum to the current sample. Latch 68 in this example is reset to zero value at the beginning of each burst by the leading transition of the burst gate pulse BG. The output of adder 66 is applied to a binary divider 78 which divides the sum by the number N of contributing magnitude samples. Not if N is a binary multiple, divider 78 may be a simple wiring configuration which sifts the bit significance of the sum samples rightward, one bit for each multiple of 2.

The number of samples that are summed by adder 66 is controlled by counter 74 and AND gate 76. Counter 74 is reset by the leading transition of the burst gate pulse delayed by delay element 72. When the counter 74 is reset it provides an output which enables AND gate 76 to apply the half-rate clock pulses to latch 68. The delay time provided by delay element 72 determines the time in the burst interval that the start of sample averaging will occur. Once reset counter 74 counts N−1 of the half-rate clock pulses after which it disables AND gate 76 from applying further clock pulses to latch 68 until it is reset by the next subsequent burst gate pulse.

The output of counter 74 is also applied to inverter 80 via delay element 79. The output of inverter 80 is coupled to the clock input of data latch 81. Data latch 81 stores the value provided by divider 78 responsive to the delayed disabling output transition from counter 74. Delay element 79 is included to insure that the last required sample is summed, and the sum divided by N before data is clocked in to latch 81. In an alternative arrangement elements 72, 74 and 76 may be eliminated if the number of samples of burst is assumed to be a fixed number. In this instance all the magnitude samples provided by latch 64 are added with the sum divided by one-half the fixed number of total samples.

The output of latch 81 is coupled to the address input of a read-only-memory (ROM) 82. ROM 82 is programmed to output the desired respective scale factors corresponding to the particular magnitudes applied as input addresses. It is noted that at the expense of a larger ROM, the divider 78 may be eliminated and the accumulated sums applied directly to the ROM address input.

Figure 3:
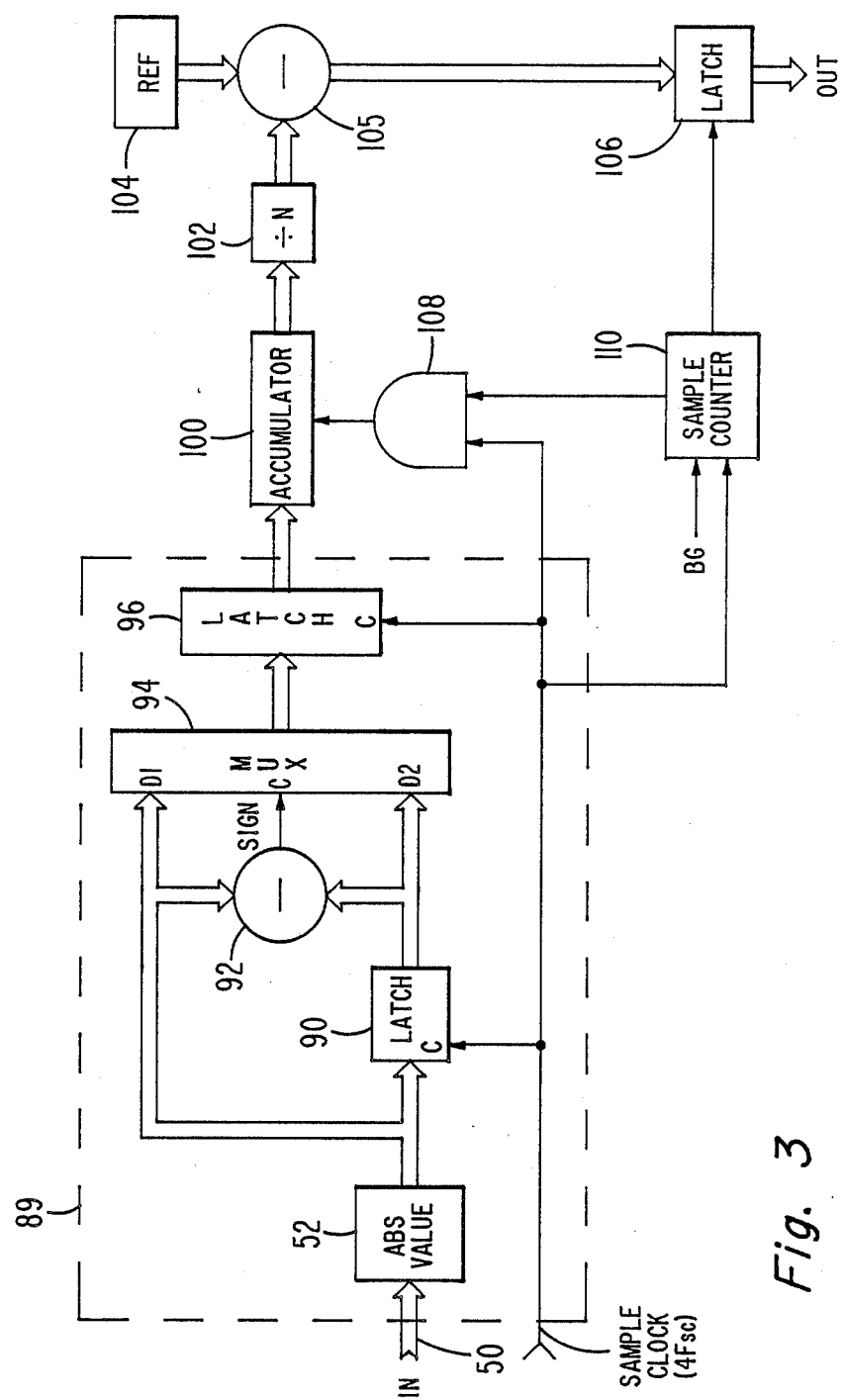

FIG. 3 shows the second embodiment of the invention wherein each sample magnitude is compared with the preceding sample magnitude. The elements circumscribed by the broken line 89 form the basic amplitude detector. The remaining elements perform amplitude averaging and generate a gain scale factor.

The sequence of samples to be measured are applied to the absolute value detector 52 via input port 50. Detector 52 produces the magnitudes of each sample, which magnitudes are coupled to the data input port of data latch 90, one data input port of multiplexor 94 and one input of subtracter 92. The output of data latch 90 is coupled to a second input port of subtracter 92 and a second data input port of multiplexor 94. Latch 90, clocked by the sample rate clock (i.e. the 4Fsc clock) delays samples by one sample period. Consequently the current sample and the immediately preceding samples are applied to respective input ports of subtracter 92 and multiplexor 94. The multiplexor 94 is controlled by the polarity (sign) bit output of subtracter 92 to couple the larger of the two samples applied to the input ports of the multiplexor, to the data input port of latch 96. Refer to FIG. 4 and consider samples S2–S6. When samples S2, S3, S4, S5 and S6 are respective current samples, the magnitudes of the samples S2, S2, S4, S4 and S6 respectively are applied to latch 96 by multiplexor 94.

The output of latch 96 is coupled to an accumulator 100 which sums N successive magnitude values. The sums are applied to the divider 102 which divides the sums by the factor N. The output of divider 102 is coupled to one input of subtracter 105, and a reference value from source 104 is coupled to a second input port of subtracter 105. The reference value may be the desired nominal value of the signal being detected. The output of subtracter 105 is thus the difference between the current measured value of the signal applied to input port 50 and the nominal value. The differences are applied to data latch 106.

Latch 106 and accumulator 100 are controlled by the sample counter 110. Sample counter 110 responsive to the burst gate signal BG and the sample clock activates the accumulator for the requisite number of sample periods and clocks the differences into latch 106 when the calculations are completed. Counter 110 may be similar to the combination of elements 72, 74, 79 and 80 in FIG. 2.

What is claimed is:

1. In apparatus for processing a sampled data signal representing a time varying signal, means for detecting the amplitude of said sampled data signal comprising:
   a signal input port for applying said sampled data signal;
   means, coupled to said signal input port, for providing pairs of magnitude samples representing the magnitudes of successive samples of said sampled data signal;
   means, coupled to said means for providing, for comparing the magnitudes of each pair of magnitude samples and generating a control signal indicating which of said magnitude samples of each of said pairs of magnitude samples is larger; and
   means responsive to said control signal, and said each pair of magnitude samples for producing the larger magnitude sample of each of said pairs of magnitude samples as an output signal corresponding to the amplitude of said sampled data signal.

2. The apparatus set forth in claim 1 further including means, coupled to said means for producing the larger magnitude sample, for developing the average of a predetermined number of said larger magnitude samples, and providing said average as said output signal.

3. The apparatus set forth in claim 1 wherein said means for providing pairs of magnitude samples comprises:
   an absolute value detector having an input port coupled to said signal input port for applying said sampled data signal, and having an output port, said absolute value detector providing, at its output port, said magnitude samples representing the magnitudes of samples applied to its input port;
   first and second data latches having respective data input ports coupled to the output port of said absolute value detector, said first data latch conditioned to successively store alternately occurring ones of said magnitude samples and said second data latch coinditioned to successively store the intervening ones of said magnitude samples.

4. The apparatus set forth in claim 1 wherein said means for providing pairs of magnitude samples comprises:
   an absolute value detector coupled to said signal input port for providing at an output terminal thereof said magnitude samples representing the magnitudes of samples applied to said signal input port;
   a data latch having an input port coupled to the output terminal of said absolute value detector, and having an output port and wherein said pairs of magnitude samples are available at the input port and the output port of said data latch.

5. In a video signal processing system for processing a sampled data signal representing a time varying composite video signal, including a phase-locked-loop for developing a clocking signal phase locked to at least a portion of said sampled data signal, said phase-locked-loop having an AGC circuit comprising:
   a signal input port for applying said sampled data signal;
   means, coupled to said signal input port, for providing pairs of magnitude samples representing the magnitudes of successive samples of said sampled data signal;
   means, coupled to said means for providing, for comparing the magnitudes of each of said pairs of magnitude samples and generating a control signal indicating which of said magnitude samples of said each pair of magnitude samples is larger;
   means responsive to said control signal for producing the larger magnitude sample of said each pair of magnitude samples as an output signal corresponding to the amplitude of said sampled data signal;
   means, coupled to said means responsive to said control signal, and responsive to said output signal, for generating scale factors related to the difference between said output signal and a predetemined value;
   means, coupled to said signal input port and said means for generating scale factors, for scaling said sampled data signal by said scale factors to provide scaled samples of said sampled data signal;
   a phase detector, coupled to said means for scaling said sampled data signal, for developing a phase error signal;
   a controlled oscillator coupled to said phase detector for generating said clocking signal;
   means, having an input terminal for receiving said time varying compositive video signal and an output coupled to said signal input port, and responsive to said clocking signal, for producing said sampled data signal from said time varying composite video signal.

6. The processing system set forth in claim 5 wherein the means for generating scale factors includes:
   an accumulator, coupled to said means for producing the larger magnitude samples for summing a predetermined number of said larger magnitude samples and producing an output sum signal;
   memory means, having an address input port coupled to said accumulator, and programmed for outputting said scale factors functionally related to respective address values.

7. The processing system set forth in claim 5, wherein the means for providing pairs of magnitude samples comprises:
   an absolute value detector having an input port coupled to said signal input port for applying said sampled data signal and having an output port, said absolute value detector providing at its output port said magnitude samples representing the magnitudes of samples applied to its input port;
   first and second data latches having respective data input ports coupled to the output port of said absolute value detector, said first data latch conditioned to successively store alternately occurring magnitude samples, and said second data latch conditioned to successively store the intervening magnitude samples occurring between said alternately occurring magnitude samples, to provide said pairs of magnitude samples.

8. The processing system set forth in claim 5, wherein the means for providing pairs of magnitude samples comprise:
   an absolute value detector coupled to said signal input port for providing at an output terminal thereof said magnitude samples representing the magnitudes of samples applied to said signal input port;
   a data latch having an input port coupled to the output terminal of said absolute value detector, and having an output port, and wherein the pairs of magnitude samples are available at the input port and the output port of said data latch.

9. The processing system set forth in claim 8 wherein the means for generating scale factors includes:
means, coupled to said means responsive to said control signal, and responsive to said output signal, for producing an average value of said output signal;
a source of a reference value;
means coupled to said source of reference value, and said averaging means, for producing said scale factors representative of the difference between said reference value and said average value of said output signal.

* * * * *